United States Patent
Chae

(10) Patent No.: US 11,735,239 B2
(45) Date of Patent: Aug. 22, 2023

(54) INPUT/OUTPUT CIRCUIT, OPERATION METHOD OF THE INPUT/OUTPUT CIRCUIT AND DATA PROCESSING SYSTEM INCLUDING THE INPUT/OUTPUT CIRCUIT

(71) Applicant: SK hynix Inc., Icheon-si (KR)

(72) Inventor: Joo Hyung Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/947,954

(22) Filed: Sep. 19, 2022

(65) Prior Publication Data

US 2023/0014221 A1    Jan. 19, 2023

Related U.S. Application Data

(63) Continuation of application No. 17/221,312, filed on Apr. 2, 2021, now Pat. No. 11,450,365.

(30) Foreign Application Priority Data

Nov. 16, 2020   (KR) .......................... 10-2020-0152917

(51) Int. Cl.
| | | |
|---|---|---|
| *G11C 7/10* | (2006.01) | |
| *G11C 7/22* | (2006.01) | |
| *G11C 7/06* | (2006.01) | |
| *G11C 8/18* | (2006.01) | |

(52) U.S. Cl.
CPC ................ *G11C 7/222* (2013.01); *G11C 7/06* (2013.01); *G11C 7/1051* (2013.01); *G11C 7/1078* (2013.01); *G11C 8/18* (2013.01)

(58) Field of Classification Search
CPC ......... G11C 7/222; G11C 7/06; G11C 7/1051; G11C 7/1078; G11C 8/18; G11C 7/1048; G11C 7/1057; G11C 7/106; G11C 7/1066; G11C 7/1084; G11C 7/1087; G11C 7/1093; G11C 7/1006; H03K 19/017509; H03K 19/018507; H03K 5/1565; G05B 19/0423
See application file for complete search history.

(56) References Cited

U.S. PATENT DOCUMENTS

| | | | |
|---|---|---|---|
| 4,751,681 A | 6/1988 | Hashimoto | |
| 6,441,649 B1 | 8/2002 | Martin et al. | |
| 6,642,748 B2 | 11/2003 | Watarai | |
| 7,728,632 B1 * | 6/2010 | Bi | ............ H03K 3/356139 327/63 |
| 11,120,846 B2 | 9/2021 | Kim et al. | |
| 2002/0084838 A1 | 7/2002 | Martin et al. | |
| 2002/0135401 A1 | 9/2002 | Watarai | |

(Continued)

FOREIGN PATENT DOCUMENTS

| | | |
|---|---|---|
| EP | 1246361 A2 | 10/2002 |
| KR | 1020160005535 A | 1/2016 |

*Primary Examiner* — Jay W. Radke
(74) *Attorney, Agent, or Firm* — William Park & Associates Ltd.

(57) ABSTRACT

An input/output circuit including: an input circuit configured to load differential input data to setup nodes based on a data strobe clock; an output circuit configured to compare and amplify the data loaded to the setup nodes, and output differential output data; and a voltage retention circuit configured to retain the setup nodes at voltage levels corresponding to the differential output data, based on the data strobe clock and the differential output data.

11 Claims, 6 Drawing Sheets

(56) References Cited

U.S. PATENT DOCUMENTS

| | | |
|---|---|---|
| 2004/0090251 A1 | 5/2004 | Watarai |
| 2005/0162193 A1* | 7/2005 | Payne .............. H03K 3/356173 |
| | | 327/52 |
| 2006/0146958 A1 | 7/2006 | Doi |
| 2007/0115031 A1 | 5/2007 | Hsu et al. |
| 2018/0302065 A1* | 10/2018 | Kim ...................... H03K 5/151 |
| 2022/0123736 A1 | 4/2022 | Hong et al. |

* cited by examiner

INPUT/OUTPUT CIRCUIT, OPERATION METHOD OF THE INPUT/OUTPUT CIRCUIT AND DATA PROCESSING SYSTEM INCLUDING THE INPUT/OUTPUT CIRCUIT

CROSS-REFERENCES TO RELATED APPLICATION

The present application is a continuation application of U.S. patent application Ser. No. 17/221,312, filed on Apr. 2, 2021, and claims priority under 35 U.S.C. § 119(a) to Korean application number 10-2020-0152917, filed on Nov. 16, 2020, in the Korean Intellectual Property Office, which is incorporated herein by reference in its entirety.

BACKGROUND

1. Technical Field

Various embodiments generally relate to an input/output circuit, an operation method of the input/output circuit and a data processing system including the input/output circuit, and more particularly, to an input/output circuit which transfers differential input data based on a data strobe clock, an operation method of transferring differential input data based on the data strobe clock, and a data processing system including the input/output circuit.

2. Related Art

In general, an integrated circuit including a semiconductor device and a semiconductor memory device receives data, performs a preset operation, and outputs the operation result. Therefore, the integrated circuit includes an input and output (input/output) circuit mounted therein and configured to receive data and output data. Such an input/output circuit needs to accurately recognize input data and output the data without a data loss. For this operation, the input/output circuit uses a data strobe clock. That is, the input/output circuit recognizes data based on the data strobe clock, and outputs the data.

SUMMARY

In an embodiment, an input/output circuit may include: an input circuit configured to load differential input data to setup nodes based on a data strobe clock; an output circuit configured to compare and amplify the data loaded to the setup nodes, and output differential output data; and a voltage retention circuit configured to retain the setup nodes at voltage levels corresponding to the differential output data, based on the data strobe clock and the differential output data.

In an embodiment, an operation method of an input/output circuit may include: precharging setup nodes of an input/output circuit; comparing and amplifying differential input data based on a data strobe clock, and outputting differential output data; and retaining the differential output data through a discharging operation on the setup nodes.

In an embodiment, a data processing system may include: a host device configured to provide differential input data and data frequency information; and a data processing device configured to receive/output the differential input data based on a data strobe clock having a duty rate corresponding to the data frequency information, wherein the data processing device includes: a clock generation circuit configured to adjust the duty rate of the data strobe clock based on the data frequency information, and generate a final data strobe clock; and an input/output circuit including: an input circuit configured to load differential input data to setup nodes based on the final data strobe clock; an output circuit configured to compare and amplify the data loaded to the setup nodes, and output differential output data; and a voltage retention circuit configured to retain the setup nodes at voltage levels corresponding to the differential output data, based on the final data strobe clock and the differential output data.

DETAILED DESCRIPTION

Figure 1:
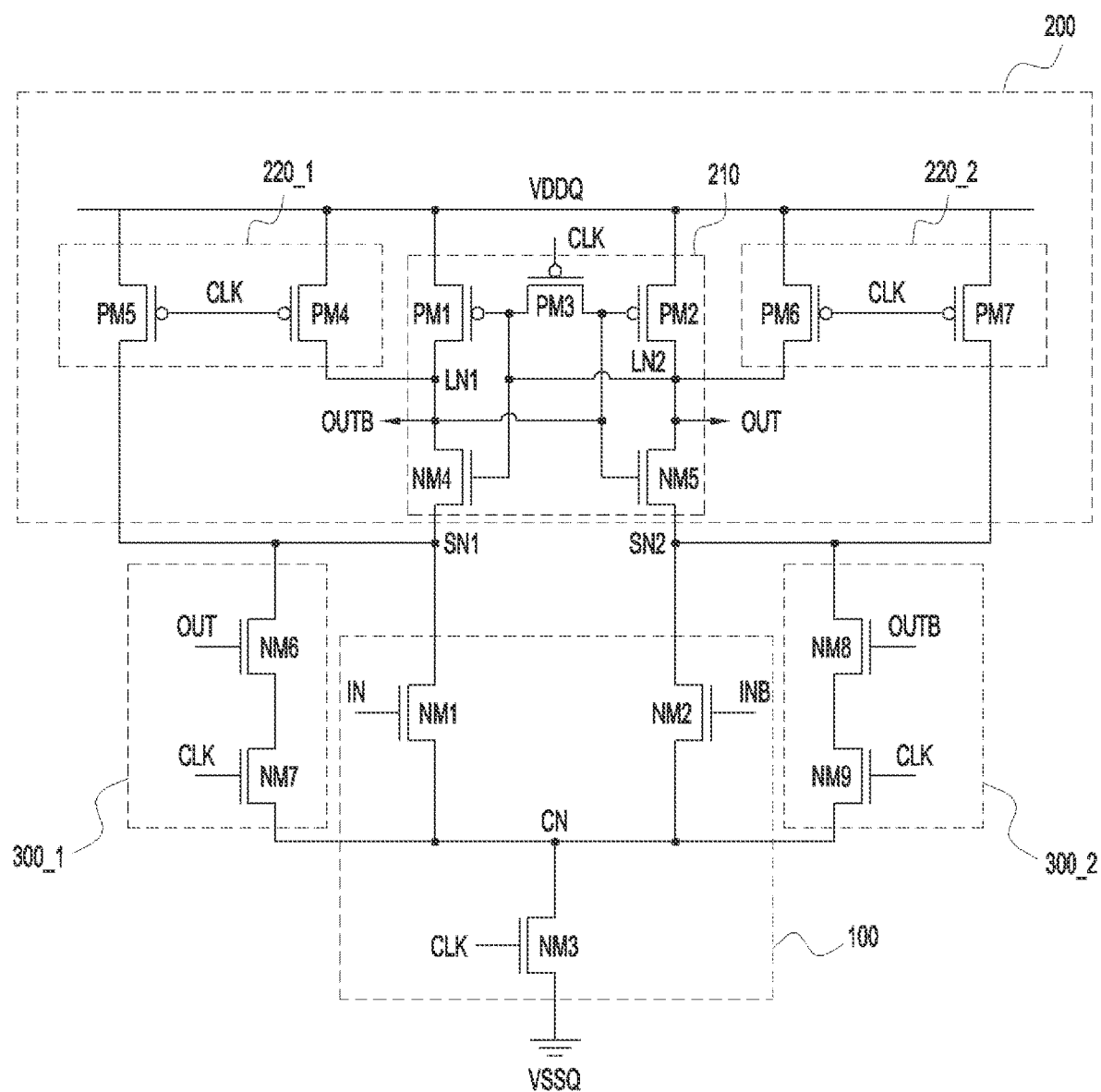
FIG. 1 is a circuit diagram illustrating a configuration of an input/output circuit in accordance with an embodiment.

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as having the same meanings as those in the context in related technology and should not be construed as having ideal or excessively formal meanings, unless clearly defined in the application.

Various embodiments are directed to an input/output circuit capable of retaining setup nodes at voltage levels corresponding to differential output data based on the differential output data, and an operation method of the input/output circuit.

Also, various embodiments are directed to a data processing system capable of adjusting the duty rate of a data strobe clock according to the frequency at which differential input data are inputted.

FIG. 1 is a circuit diagram illustrating a configuration of an input/output circuit in accordance with an embodiment.

Referring to FIG. 1, the input/output circuit may include an input circuit 100, an output circuit 200 and a voltage retention circuit including first and second voltage retention circuits 300_1 and 300_2.

The input circuit 100 may be configured to load differential input data IN and INB to setup nodes SN1 and SN2 based on a data strobe clock CLK. The data strobe clock CLK may be a clock signal for synchronizing the differential input data IN and INB. The data strobe clock CLK may have a duty rate of 50:50. The differential input data IN and INB may include primary input data IN and secondary input data INB. The primary input data IN and the secondary input data INB may be exactly out of phase.

The input circuit 100 will be described more as follows. The input circuit 100 may include first to third NMOS transistors NM1 to NM3.

The first NMOS transistor NM1 may have drain and source terminals coupled between the first setup node SN1 and the third NMOS transistor NM3, and a gate terminal configured to receive the primary input data IN. The second NMOS transistor NM2 may have drain and source terminals coupled between the second setup node SN2 and the third NMOS transistor NM3, and a gate terminal configured to receive the secondary input data INB. The third NMOS transistor NM3 may have drain and source terminals coupled between a ground voltage terminal VSSQ and a common node CN to which the first and second NMOS transistors are coupled, and a gate terminal configured to receive the data strobe clock CLK.

Through the above-described configuration, the input circuit 100 may load primary/secondary input data IN and INB to the first and second setup nodes SN1 and SN2 while a data strobe clock CLK is logic 'high'. In other words, when the primary input data IN becomes logic 'high' while the data strobe clock CLK is logic 'high', the voltage level of the first setup node SN1 of the input circuit 100 may be lowered. This may indicate that the primary input data IN may be loaded to the first setup node SN1. When the secondary input data INB becomes logic 'high' while the data strobe clock CLK is logic 'high', the voltage level of the second setup node SN2 of the input circuit 100 may be lowered. This may indicate that the secondary input data INB may be loaded to the second setup node SN2.

The output circuit 200 may be configured to compare and amplify the data loaded to the first and second setup nodes SN1 and SN2 serving as setup nodes, and output differential output data OUT and OUTB. The output circuit 200 may compare and amplify the voltage levels of the first and second setup nodes SN1 and SN2. The output circuit 200 may output the amplified data as primary output data OUT and secondary output data OUTB which are the differential output data OUT and OUTB.

The output circuit 200 will be described more as follows. The output circuit 200 may include an amplifier circuit 210 and precharging circuits 220_1 and 220_2.

The amplifier circuit 210 may be configured to compare and amplify the data loaded to the first and second setup nodes SN1 and SN2. The amplifier circuit 210 may include first to third PMOS transistors PM1 to PM3 and fourth and fifth NMOS transistors NM4 and NM5.

The first PMOS transistor PM1 may have source and drain terminals coupled between a supply voltage terminal VDDQ and a first amplification node LN1, and the second PMOS transistor PM2 may have source and drain terminals coupled between the supply voltage terminal VDDQ and a second amplification node LN2. The third PMOS transistor PM3 may have source and drain terminals coupled between gate terminals of the first and second PMOS transistors PM1 and PM2, and a gate terminal configured to receive the data strobe clock CLK. The fourth NMOS transistor NM4 may have drain and source terminals coupled between the first amplification node LN1 and the first setup node SN1, and the fifth NMOS transistor NM5 may have drain and source terminals coupled between the second amplification node LN2 and the second setup node SN2. The first and second PMOS transistors PM1 and PM2 may have the gate terminals cross-coupled to each other, and the fourth and fifth NMOS transistors NM4 and NM5 may have gate terminals cross-coupled to each other.

The precharging circuits 220_1 and 220_2 may be configured to precharge the first and second setup nodes SN1 and SN2 and an output terminal of the amplifier circuit 210, based on the data strobe clock CLK. The output terminal of the amplifier circuit 210 may indicate the first and second amplification nodes LN1 and LN2 from which the differential output data OUT and OUTB are output.

The precharging circuits 220_1 and 220_2 may include a first precharging circuit 220_1 and a second precharging circuit 220_2.

The first precharging circuit 220_1 may include fourth and fifth PMOS transistors PM4 and PM5. The fourth PMOS transistor PM4 may have source and drain terminals coupled between the supply voltage terminal VDDQ and the first amplification node LN1, and the fifth PMOS transistor PM5 may have source and drain terminals coupled between the supply voltage terminal VDDQ and the first setup node SN1. Each of the fourth and fifth PMOS transistors PM4 and PM5 may be configured to receive the data strobe clock CLK at a gate terminal thereof.

The second precharging circuit 220_2 may include sixth and seventh PMOS transistors PM6 and PM7. The sixth PMOS transistor PM6 may have source and drain terminals coupled between the supply voltage terminal VDDQ and the second amplification node LN2, and the seventh PMOS transistor PM7 may have source and drain terminals coupled between the supply voltage terminal VDDQ and the second setup node SN2. Each of the sixth and seventh PMOS transistors PM6 and PM7 may be configured to receive the data strobe clock CLK at a gate terminal thereof.

Hereafter, a circuit operation of the output circuit 200 will be described briefly.

When the data strobe clock CLK becomes logic 'low', the third to seventh PMOS transistors PM3 to PM7 may be turned on, and the first and second amplification nodes LN1 and LN2 and the first and second setup nodes SN1 and SN2 may be precharged with a voltage level corresponding to the supply voltage terminal VDDQ. Then, when the data strobe clock CLK becomes logic 'high', the third and seventh PMOS transistors PM3 to PM7 may be turned off. The first and second amplification nodes LN1 and LN2 may have a voltage difference which occurs according to the voltage levels of the first and second setup nodes SN1 and SN2. Therefore, the cross-coupled first and second PMOS transistors PM1 and PM2 and the cross-coupled fourth and fifth NMOS transistors NM4 and NM5 may amplify the voltage levels of the first and second amplification nodes LN1 and LN2. The amplification result of the first amplification node LN1 may become the secondary output data OUTB, and the amplification result of the second amplification node LN2 may become the primary output data OUT.

Through the above-described configuration, the output circuit 200 may compare and amplify the data loaded to the first and second setup nodes SN1 and SN2. The output circuit 200 may output the amplified data as the primary output data OUT and the secondary output data OUTB.

The first and second voltage retention circuits 300_1 and 300_2 may be configured to retain the first and second setup nodes SN1 and SN2 at voltage levels corresponding to the differential output data OUT and OUTB fed back to the first and second setup nodes SN1 and SN2, based on the data strobe clock CLK and the differential output data OUT and OUTB. The first and second voltage retention circuits 300_1 and 300_2 may respectively include a first discharging circuit 300_1 and a second discharging circuit 300_2.

The first discharging circuit 300_1 may be configured to discharge the first setup node SN1 based on the primary output data OUT and the data strobe clock CLK.

The first discharging circuit 300_1 will be described below as follows. The first discharging circuit 300_1 may include sixth and seventh NMOS transistors NM6 and NM7. The sixth and seventh NMOS transistors NM6 and NM7 may be coupled in series between the first setup node SN1 and the common node CN. The sixth NMOS transistor NM6 may be configured to receive the primary output data OUT at a gate terminal thereof, and the seventh NMOS transistor NM7 may be configured to receive the data strobe clock CLK at a gate terminal thereof. Thus, when the data strobe clock CLK and the primary output data OUT become logic 'high', for example, the first setup node SN1 may be discharged to a voltage level corresponding to the ground voltage terminal VSSQ.

The second discharging circuit 300_2 may be configured to discharge the second setup node SN2 based on the secondary output data OUTB and the data strobe clock CLK.

The second discharging circuit 300_2 will be described below as follows. The second discharging circuit 300_2 may include eighth and ninth NMOS transistors NM8 and NM9. The eighth and ninth NMOS transistors NM8 and NM9 may be coupled in series between the second setup node SN2 and the common node CN. The eighth NMOS transistor NM8 may be configured to receive the secondary output data OUTB at a gate terminal thereof, and the ninth NMOS transistor NM9 may be configured to receive the data strobe clock CLK at a gate terminal thereof. Thus, when the data strobe clock CLK and the secondary output data OUTB become logic 'high', for example, the second setup node SN2 may be discharged to a voltage level corresponding to the ground voltage terminal VSSQ.

Through the above-described configuration, the first discharging circuit 300_1 may be configured to discharge the first setup node SN1 based on the primary output data OUT and the data strobe clock CLK. Therefore, the first setup node SN1 may retain a voltage level corresponding to the differential output data OUT and OUTB based on the primary output data OUT. For example, when the primary input data IN is logic 'high', the first setup node SN1 may become logic 'low', and the primary output data OUT may become logic 'high'. Then, the first discharge circuit 300_1 may retain the voltage level of the first setup node SN1 at a logic 'low' level, based on the primary output data OUT. That is, the first setup node SN1 may retain a voltage level corresponding to the differential data OUT and OUTB.

Then, the second discharging circuit 300_2 may discharge the second setup node SN2 based on the secondary output data OUTB and the data strobe clock CLK. Therefore, the second setup node SN2 may retain a voltage level corresponding to the differential output data OUT and OUTB based on the secondary output data OUTB.

The input/output circuit in accordance with an embodiment may retain the voltage levels of the first and second setup nodes SN1 and SN2 at voltage levels corresponding to the differential output data OUT and OUTB through the discharging operation. Therefore, the input/output circuit may stably retain the differential output data OUT and OUTB even though undesired noise is generated in the differential input data IN and INB.

Figure 2:
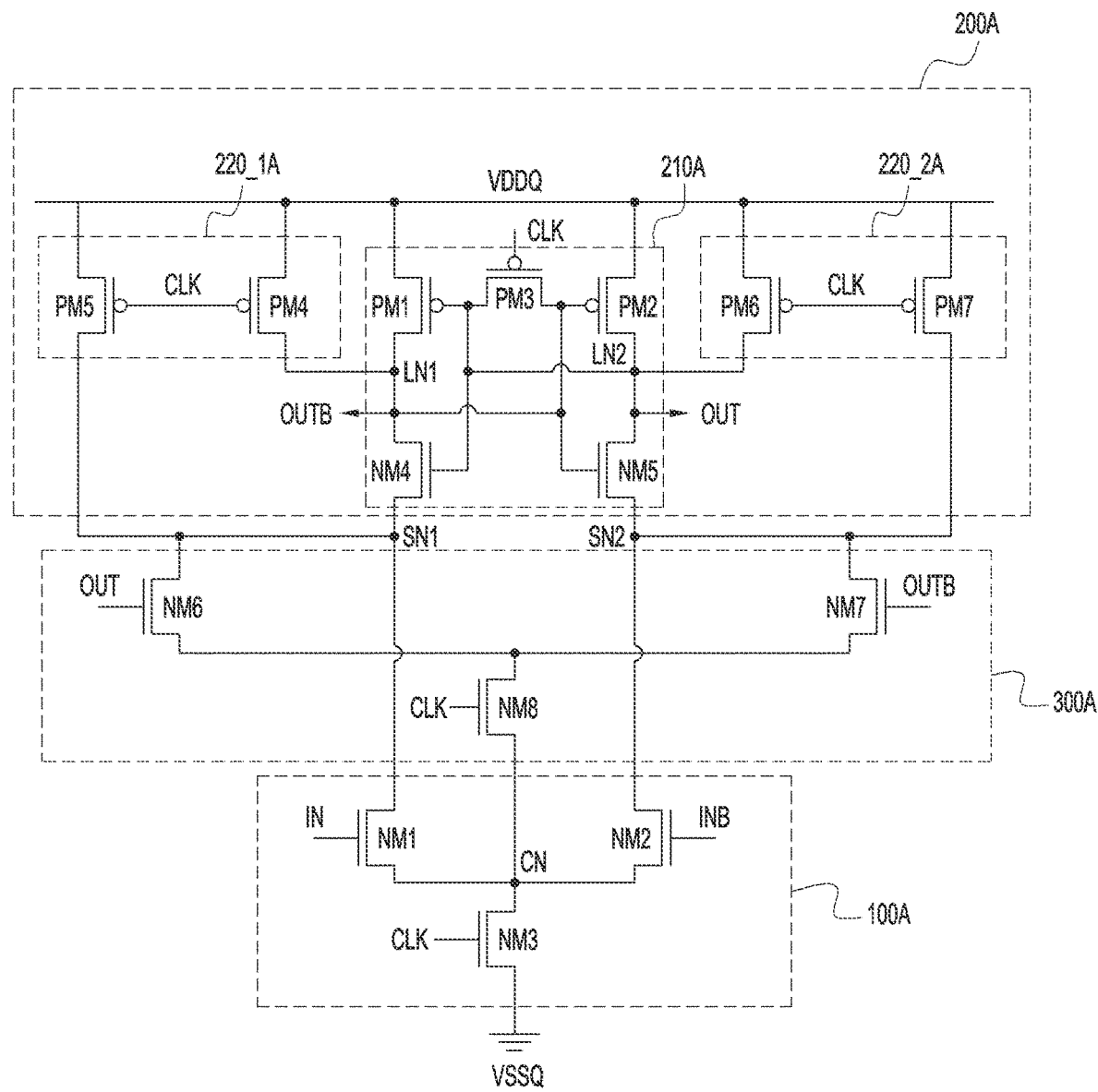
FIG. 2 is a circuit diagram illustrating a configuration of an input/output circuit in accordance with an embodiment.

FIG. 2 is a circuit diagram illustrating a configuration of an input/output circuit in accordance with an embodiment.

Referring to FIG. 2, the input/output circuit may include an input circuit 100A, an output circuit 200A and a voltage retention circuit 300A. The output circuit 200A may include an amplifier circuit 210A and precharging circuits 220_1A and 220_2A. Since the input circuit 100A and the output circuit 200A of FIG. 2 may correspond to the input circuit 100 and the output circuit 200 of FIG. 1, respectively, the detailed descriptions of the circuit configurations and operations thereof will be omitted herein. The following descriptions will be focused on the voltage retention circuit 300A having a configuration compared to that of FIG. 1.

The voltage retention circuit 300A may be configured to retain the setup nodes SN1 and SN2 at voltage levels corresponding to the differential output data OUT and OUTB fed back thereto, based on the data strobe clock CLK and the differential output data OUT and OUTB.

The voltage retention circuit 300A will be described below as follows. The voltage retention circuit 300A may include sixth to eighth NMOS transistors NM6 to NM8.

The sixth NMOS transistor NM6 may be defined as a first discharging circuit for forming a discharging path of the first setup node SN1 based on the primary output data OUT. The sixth NMOS transistor NM6 may have drain and source terminals coupled between the first setup node SN1 and the eighth NMOS transistor NM8, and a gate terminal configured to receive the primary output data OUT.

The seventh NMOS transistor NM7 may be defined as a second discharging circuit for forming a discharging path of the second setup node SN2 based on the secondary output data OUTB. The seventh NMOS transistor NM7 may have drain and source terminals coupled between the second setup node SN2 and the eighth NMOS transistor NM8, and a gate terminal configured to receive the secondary output data OUTB.

The eighth NMOS transistor NM8 may be defined as a common discharging circuit for forming a common discharging path based on the data strobe clock CLK. The eighth NMOS transistor NM8 may be coupled to the sixth and seventh NMOS transistors NM6 and NM7 in common. The eighth NMOS transistor NM8 may have drain and source terminals coupled between the common node CN and the source terminals of the sixth and seventh NMOS transistors NM6 and NM7, and a gate terminal configured to receive the data strobe clock CLK.

Hereafter, a circuit operation of the voltage retention circuit 300A will be described briefly.

When the data strobe clock CLK becomes logic 'high', the eighth NMOS transistor NM8 may be turned on. At this time, when the primary output data OUT becomes logic 'high', the sixth NMOS transistor NM6 may be turned on. Thus, the first setup node SN1 may be coupled to the discharging path formed in the sixth NMOS transistor NM6 and a common discharging path formed in the eighth NMOS transistor NM8. Therefore, the first setup node SN1 may be discharged. Furthermore, when the secondary output data OUTB becomes logic 'high' while the data strobe clock CLK is logic 'high', the seventh NMOS transistor NM7 may be turned on. Thus, the second setup node SN2 may be coupled to the discharging path formed in the seventh NMOS transistor NM7 and the common discharging path formed in the eighth NMOS transistor NM8. Therefore, the second setup node SN2 may be discharged.

The input/output circuit in accordance with an embodiment may include the sixth to eighth NMOS transistors NM6 to NM8. Therefore, the input/output circuit may secure the discharging paths for the first and second setup nodes SN1 and SN2 with a minimum circuit area.

Figure 3:
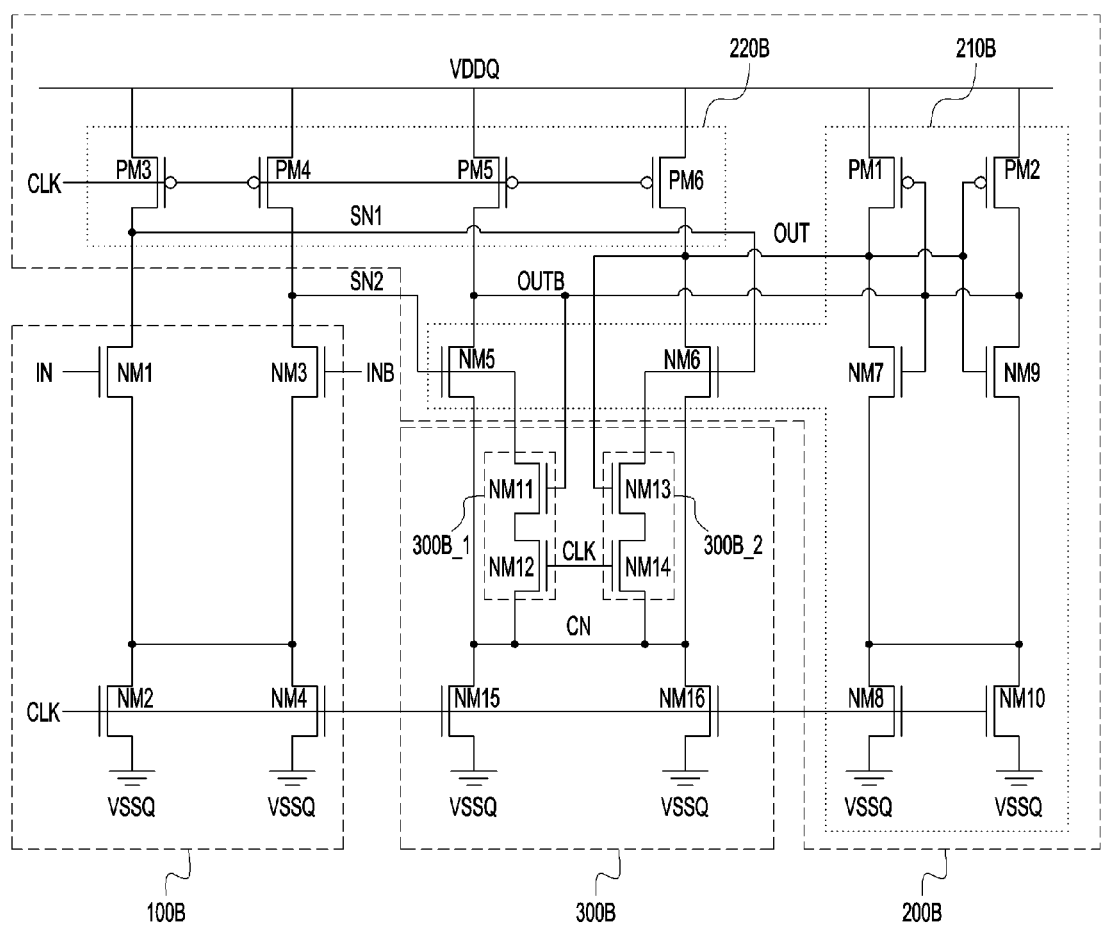
FIG. 3 is a circuit diagram illustrating a configuration of an input/output circuit in accordance with an embodiment.

FIG. 3 is a circuit diagram illustrating a configuration of an input/output circuit in accordance with an embodiment.

Referring to FIG. 3, the input/output circuit may include an input circuit 100B, an output circuit 200B and a voltage retention circuit 300B. Since the input circuit 100B, the output circuit 200B and the voltage retention circuit 300B may correspond to the input circuit 100, the output circuit 200 and the voltage retention circuits of FIG. 1, respectively, configurations and operations thereof will be briefly described as follows.

The input circuit 100B may include first to fourth NMOS transistors NM1 to NM4.

The first and second NMOS transistors NM1 and NM2 may be coupled in series between the first setup node SN1 and the ground voltage terminal VSSQ. The third and fourth NMOS transistors NM3 and NM4 may be coupled in series between the second setup node SN2 and the ground voltage terminal VSSQ. The first NMOS transistor NM1 may be configured to receive the primary input data IN at a gate terminal thereof, and the third NMOS transistor NM3 may be configured to receive the secondary input data INB at a gate terminal thereof. Each of the second and fourth NMOS transistors NM2 and NM4 may be configured to receive the data strobe clock CLK at a gate terminal thereof. Thus, the input circuit 100B may load the primary/secondary input data IN and INB to the first and second setup nodes SN1 and SN2 based on the data strobe clock CLK.

Then, the output circuit 200B may include an amplifier circuit 210B and a precharging circuit 220B.

The amplifier circuit 210B may include first and second PMOS transistors PM1 and PM2 and fifth to tenth NMOS transistors NM5 to NM10. The first PMOS transistor PM1 and the seventh and eighth NMOS transistors NM7 and NM8 may be coupled in series between the supply voltage terminal VDDQ and the ground voltage terminal VSSQ. The second PMOS transistor PM2 and the ninth and tenth NMOS transistors NM9 and NM10 may be coupled in series between the supply voltage terminal VDDQ and the ground voltage terminal VSSQ. The first and second PMOS transistors PM1 and PM2 may have the gate terminals cross-coupled to each other, and the seventh and ninth NMOS transistors NM7 and NM9 may have gate terminals cross-coupled to each other. Each of the eighth and tenth NMOS transistors NM8 and NM10 may be configured to receive the data strobe clock CLK at a gate terminal thereof. The fifth NMOS transistor NM5 may have drain and source terminals coupled between a node from which the secondary output data OUTB is output and a 15th NMOS transistor NM15 which will be described below, and a gate terminal coupled to the second setup node SN2. The sixth NMOS transistor NM6 may have drain and source terminals coupled between a node from which the primary output data OUT is output and a 16th NMOS transistor NM16 which will be described below, and a gate terminal coupled to the first setup node SN1.

The precharging circuit 220B may include third to sixth PMOS transistors PM3 to PM6. The third PMOS transistor PM3 may have source and drain terminals coupled between the supply voltage terminal VDDQ and the first setup node SN1, and the fourth PMOS transistor PM4 may have source and drain terminals coupled between the supply voltage terminal VDDQ and the second setup node SN2. The fifth PMOS transistor PM5 may have source and drain terminals coupled between the supply voltage terminal VDDQ and the fifth NMOS transistor NM5, and the sixth PMOS transistor PM6 may have source and drain terminals coupled between the supply voltage terminal VDDQ and the sixth NMOS transistor NM6. Each of the third to sixth PMOS transistors PM3 to PM6 may be configured to receive the data strobe clock CLK at a gate terminal thereof.

Thus, the output circuit 200B may compare and amplify the data loaded to the first and second setup nodes SN1 and SN2, and output the amplified data as the primary/secondary differential output data OUT and OUTB.

The voltage retention circuit 300B may include a first discharging circuit 300B_1 and a second discharging circuit 300B_2.

The first discharging circuit 300B_1 may include 11th and 12th NMOS transistors NM11 and NM12, and the second discharging circuit 300B_2 may include 13th and 14th NMOS transistors NM13 and NM14. The 11th and 12th NMOS transistors NM11 and NM12 may be coupled in series between the second setup node SN2 and the common node CN, and the 13th and 14th NMOS transistors NM13 and NM14 may be coupled in series between the first setup node SN1 and the common node CN. The 11th NMOS transistor NM11 may be configured to receive the secondary output data OUTB at a gate terminal thereof, and the 13th NMOS transistor NM13 may be configured to receive the primary output data OUT at a gate terminal thereof. Each of the 12th and 14th NMOS transistors NM12 and NM14 may be configured to receive the data strobe clock CLK at a gate terminal thereof. The voltage retention circuit 300B may have include 15th and 16th NMOS transistors NM15 and NM16 each having drain and source terminals coupled between the common node CN and the ground voltage terminal, and a gate terminal configured to receive the data strobe clock CLK.

Thus, the voltage retention circuit 300B may be configured to retain the first and second setup nodes SN1 and SN2 at voltage levels corresponding to the primary/secondary output data OUT and OUTB fed back thereto, based on the data strobe clock CLK and the primary/secondary output data OUT and OUTB.

Figure 4:
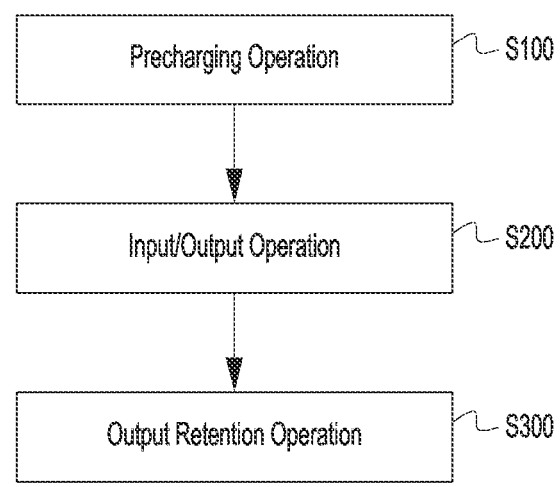
FIG. 4 is a schematic diagram illustrating an operation method of the input/output circuit of FIG. 1.

FIG. 4 is a schematic diagram illustrating an operation method of the input/output circuit of FIG. 1.

Referring to FIGS. 1 and 4, the operation method of the input/output circuit may include a precharging operation step S100, an input/output operation step S200 and an output retention operation step S300.

The precharging operation step S100 may include precharging the first and second setup nodes SN1 and SN2 of the input/output circuit of FIG. 1. In this connection, the first precharging circuit 220_1 of FIG. 1 may precharge the first setup node SN1, and the second precharging circuit 220_2 may precharge the second setup node SN2.

The input/output operation step S200 may include comparing and amplifying the differential input data IN and INB based on the data strobe clock CLK, and outputting the differential output data OUT and OUTB. In this connection, the input circuit 100 and the amplifier circuit 210 of FIG. 1 may compare and amplify the differential input data IN and INB, and output the differential output data OUT and OUTB.

The output retention operation step S300 may include retaining the differential output data OUT and OUTB through a discharging operation on the first and second setup nodes SN1 and SN2. In this connection, the first discharging circuit 300_1 of FIG. 1 may discharge the first setup node SN1 based on the primary output data OUT and the data strobe clock CLK. Therefore, the secondary output data OUTB may retain the current voltage level even though the voltage levels of the differential input data IN and INB are changed. The second discharging circuit 300_2 may discharge the second setup node SN2 based on the secondary output data OUTB and the data strobe clock CLK. Therefore, the primary output data OUT may retain the current voltage level even though the voltage levels of the differential input data IN and INB are changed.

Figure 5:
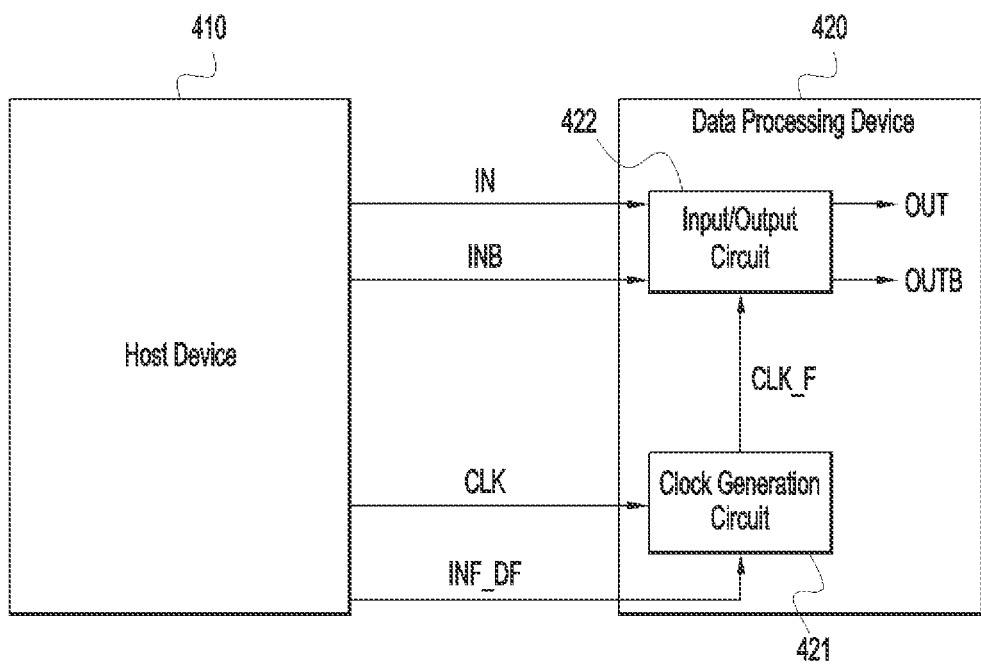
FIG. 5 is a block diagram illustrating a configuration of a data processing system in accordance with an embodiment.

FIG. 5 is a block diagram illustrating a configuration of a data processing system in accordance with an embodiment.

Referring to FIG. 5, the data processing system may include a host device 410 and a data processing device 420.

The host device 410 may be configured to provide differential input data IN and INB and data frequency information INF_DF. The data frequency information INF_DF may have information corresponding to the period in which the differential input data IN and INB are inputted, i.e. the input frequency of the data. FIG. 5 illustrates that the data strobe clock CLK is provided by the host device 410. The data strobe clock CLK may be generated in the data processing device 420 as well as the host device 410.

The data processing device 420 may be configured to receive/output the differential input data IN and INB based on the data strobe clock CLK having a duty rate corresponding to the data frequency information INF_DF.

The data processing device 420 will be described below as follow. The data processing device 420 may include a clock generation circuit 421 and an input/output circuit 422.

The clock generation circuit 421 may be configured to adjust the duty rate of the data strobe clock CLK based on the data frequency information INF_DF. The clock generation circuit 421 may generate a final data strobe clock CLK_F by adjusting the duty rate of the data strobe clock CLK. In an embodiment, the clock generation circuit 421 may be configured to adjust the duty rate of the data strobe clock CLK based on input frequencies of the differential input data IN and INB.

The input/output circuit 422 may be configured to receive/output the differential input data IN and INB based on the final data strobe clock CLK_F. The input/output circuit 422 may generate primary output data OUT corresponding to the primary input data IN and secondary output data OUTB corresponding to the secondary input data INB. Since the configuration and operation of the input/output circuit 422 have been already described with reference to FIGS. 1 to 4, the detailed descriptions thereof will be omitted herein.

Figure 6:
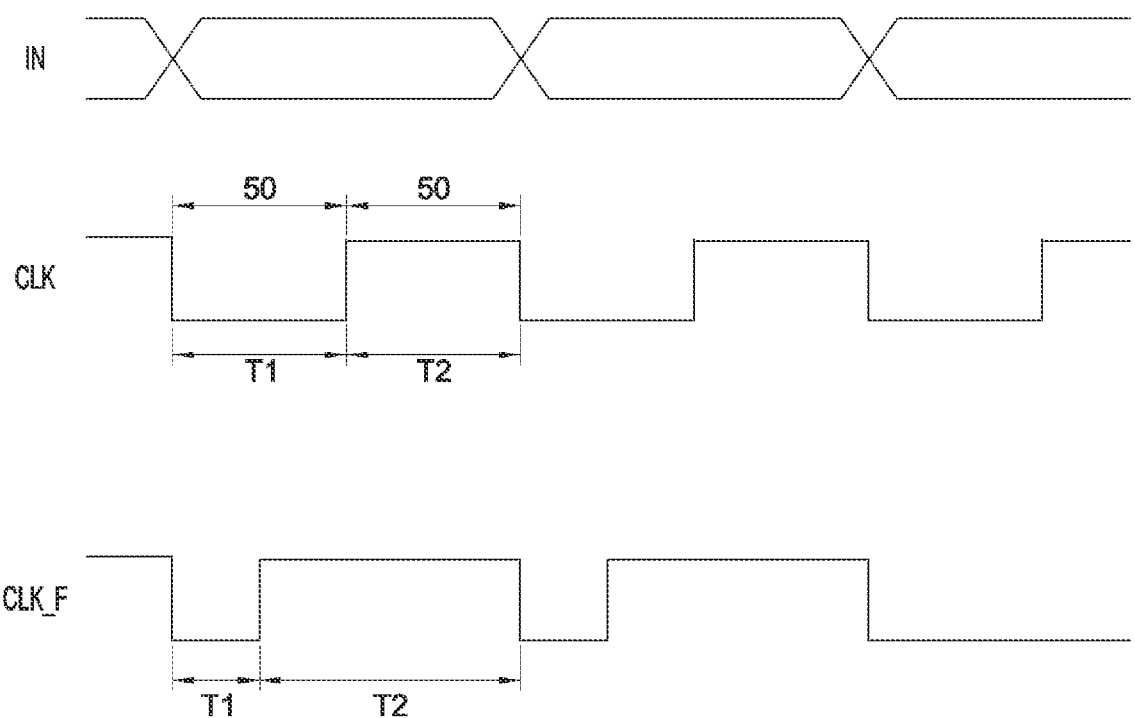
FIG. 6 is a diagram illustrating a control operation of the data processing system of FIG. 5.

FIG. 6 is a diagram illustrating a control operation of the data processing system of FIG. 5.

FIG. 6 illustrates the operation waveforms of the primary input data IN, the data strobe clock CLK and the final data strobe clock CLK_F. For convenience of description, a time interval in which the final data strobe clock CLK_F is logic 'low' is defined as "initialization operation time interval T1", and a time interval in which the final data strobe clock CLK_F is logic 'high' is defined as "loading and output operation time interval T2"

Referring to FIGS. 5 and 6, the host device 410 may provide the differential input data IN and INB, the data strobe clock CLK and the data frequency information INF_DF to the data processing device 420. At this time, suppose that the duty rate of the data strobe clock CLK is 50:50. Furthermore, suppose that the differential input data IN and INB are inputted in a relatively large period, i.e. at a relatively low frequency. Therefore, the data frequency information INF_DF may have information indicating that the differential input data IN and INB are inputted at a low frequency. The data frequency information INF_DF may be designed to include frequency information higher than a preset frequency and frequency information lower than the preset frequency, using one logic level. The data frequency information INF_DF may be designed to include pieces of information corresponding to a plurality of frequencies, respectively, through two or more code signals.

The clock generation circuit 421 may generate the final data strobe clock CLK_F by adjusting the duty rate of the data strobe clock CLK based on the data frequency information INF_DF. As illustrated in FIG. 5, the duty rate of the final data strobe clock CLK_F may be different from the duty rate of the data strobe clock CLK.

The output operation time interval T2 defined by the final data strobe clock CLK_F may be longer than the initialization operation time interval T1. When the loading and output operation time interval T2 is long, it indicates that the valid data time intervals of the primary/second output data OUT and OUTB are lengthened. When the valid data time intervals are lengthened, data may be inversed by a leakage current. As described with reference to FIGS. 1 to 3, the input/output circuit 422 may retain the primary/secondary output data OUT and OUTB through a discharging operation.

The data processing system in accordance with the present embodiment may adjust the duty rate of the data strobe clock CLK according to the frequency at which the differential input data IN and INB are inputted. Therefore, the data processing system can secure the stable valid data time interval for the primary/secondary output data OUT/OUTB.

In accordance with the present embodiments, the input/output circuit, the operation method and the data processing system can stably retain differential output data, thereby raising the reliability of the differential output data.

Furthermore, the input/output circuit, the operation method and the data processing system can adjust the duty rate of the data strobe clock according to the frequency at which differential output data are inputted, thereby minimizing power consumed to generate and retain the differential output data.

While various embodiments have been described above, it will be understood to those skilled in the art that the embodiments described are examples only. Accordingly, the operating method of a data storage device described herein should not be limited based on the described embodiments.

What is claimed is:

1. A semiconductor integrated circuit, comprising:
an input circuit block configured to receive a first input signal and a second input signal based on a clock;
an output circuit block configured to electrically connect to the input circuit block through a first connection node and a second connection node, and output a first output signal and a second output signal based on the first input signal, the second input signal based on the clock; and
a discharging block configured to selectively discharge one of the first and second connection nodes based on the first and second output signals and the clock.

2. The semiconductor integrated circuit according to claim 1,
wherein the output circuit block is configured to compare and amply a first data loaded on the first connection node and a second data loaded on the second connection node and to output comparing results as the first output signal and the second output signal.

3. The semiconductor integrated circuit according to claim 1, wherein the output circuit comprises:
an amplifier circuit configured to compare and amplify data loaded to the first and second connection nodes; and
at least one precharging circuit configured to precharge one of the first and second connection nodes and an output terminal of the amplifier circuit, based on the clock.

4. The semiconductor integrated circuit according to claim 1, wherein the discharging block includes:
a first discharging circuit configured to discharge the first connection node based on the first output signal and the clock; and
a second discharging circuit configured to discharge the second connection node based on the second output signal and the clock.

5. The semiconductor integrated circuit according to claim 4, wherein the discharging block further includes:
a common discharging circuit coupled to the first and second discharging circuits in common, and configured to form a common discharging path based on the clock.

6. The semiconductor integrated circuit according to claim 1, further comprising:
a clock generation circuit configured to adjust a duty ratio of the clock based on input frequencies of the first and second input signals.

7. A semiconductor integrated circuit, comprising:
an input circuit block receiving a first input data and a second input data based on a clock that is toggled between a logic high level and logic low level;
an output circuit block configured to be electrically connected to the input circuit block through a first setup node and a second setup node and output a first output data and a second output data based on voltage levels of the first and a second input data; and
a voltage retention circuit block configured to keep voltage levels of the first and second setup nodes to the voltage levels of the first and second output data while the clock remains the logic high level.

8. The semiconductor integrated circuit according to claim 7, wherein a voltage level of the first output data corresponds to an amplified voltage level of the second input data, and a voltage level of the second output data corresponds to an amplified voltage level of the first input data.

9. The semiconductor integrated circuit according to claim 8, wherein the voltage retention circuit includes:
a first discharging circuit configured to be connected to the first setup node, and selectively hold and discharge the voltage level of the first setup node based on the voltage level of the second output data; and
a second discharging circuit configured to be connected to the second setup node, and selectively hold and discharge the voltage level of the second setup node based on the voltage level of the first output data.

10. The semiconductor integrated circuit of claim 7, wherein the input circuit block is configured to receive the first input data and the second input data when the clock is the logic high.

11. The semiconductor integrated circuit of claim 10, wherein the first setup node and the second setup node are precharged to a setting voltage when the clock is the logic low.

* * * * *